United States Patent [19]
Matusita

[11] Patent Number: 5,954,072
[45] Date of Patent: Sep. 21, 1999

[54] ROTARY PROCESSING APPARATUS

[75] Inventor: Mitiaki Matusita, Yatsushiro, Japan

[73] Assignee: Tokyo Electron Limited, Tokyo, Japan

[21] Appl. No.: 09/012,791

[22] Filed: Jan. 23, 1998

[30] Foreign Application Priority Data

Jan. 24, 1997 [JP] Japan .................................. 9-025833

[51] Int. Cl.⁶ .................................................. B08B 3/04
[52] U.S. Cl. ......................... 134/149; 134/153; 134/157; 134/902; 34/58; 414/941
[58] Field of Search ..................... 134/137, 140, 134/149, 153, 157, 902; 34/312, 313, 317, 58; 414/744.8, 936, 941

[56] References Cited

U.S. PATENT DOCUMENTS

| | | |
|---|---|---|
| 4,421,056 | 12/1983 | Tateyama et al. . |
| 4,724,619 | 2/1988 | Poli et al. . |
| 4,788,994 | 12/1988 | Shinbara . |
| 5,100,502 | 3/1992 | Murdock .................................. 414/941 |
| 5,421,056 | 6/1995 | Tateyama et al. . |
| 5,445,172 | 8/1995 | Thompson et al. . |
| 5,566,466 | 10/1996 | Hearne . |
| 5,666,985 | 9/1997 | Smith, Jr. et al. . |
| 5,830,272 | 11/1998 | Begin et al. ............................. 414/941 |
| 5,851,041 | 12/1998 | Anderson et al. ....................... 414/941 |

*Primary Examiner*—Frankie L. Stinson
*Attorney, Agent, or Firm*—Oblon, Spivak, McClelland, Maier & Neustadt, P.C.

[57] ABSTRACT

A rotary processing apparatus comprises a rotary table on which a substrate to be processed is placed, a rotary drive means for rotating the rotary table, a plurality of holding members each rotating together with the rotary table having a rotation supporting point at a position close to a peripheral portion of the rotary table, for holding a peripheral portion of the substrate above the rotary table, and including one end having a holding portion for holding the substrate to be processed and the other end having a portion to be pressed, an urging member provided on the rotary table, for urging the holding portion of each of the plurality of holding members towards a center of the rotary table, a pressing member provided underneath the rotary table for pressing the portion to be pressed to a direction opposite to the urging direction of the urging member, and a drive mechanism for driving the pressing member in up and down directions.

23 Claims, 7 Drawing Sheets

ROTARY PROCESSING APPARATUS

BACKGROUND OF THE INVENTION

The present invention relates to a rotary processing apparatus for carrying out a predetermined process on a substrate to be processed, while rotating the substrate by means of a rotary table.

In a so-called photolithographic step of, for example, a semiconductor manufacturing process, a substrate to be processed, such as a semiconductor wafer (to be called wafer hereinafter) is cleaned, and a photoresist solution is applied on the surface of the wafer, thus forming a photoresist film on the substrate. Further, the photoresist film is exposed with a predetermined pattern, and then developed with a developer solution. For carrying out such a series of processing steps, a rotary processing apparatus is conventionally employed so as to carry out a predetermined process on a wafer while rotating the wafer by means of the rotary table.

In the case of such a rotary processing apparatus where a wafer is rotated on the rotary table driven by a motor serving as a rotary drive source, it is essential that the wafer is held firmly on the rotary table and rotated together with the rotary table. Therefore, a mechanical holding mechanism called, for example, mechanical chuck is conventionally used. The conventional mechanical holding mechanism holds a wafer by holding the outer periphery of the wafer from an outer side with a clamp member such as nail or ring. In the case of the conventional holding mechanism, the necessary holding force is obtained by utilizing the centrifugal force generated, for example, by the rotation of the rotary table.

However, in the conventional technique, if the rotation speed of the rotary table does not reach a certain degree, a holding force sufficient to hold a wafer cannot be obtained. For example, immediately after the start of the rotation of the rotary table, the rotary table has not yet been rotated at a sufficient rotational speed, and thus a necessary centrifugal force cannot be obtained. As a result, the positional displacement of the wafer easily occurs on the rotary table. Further, immediately before the rotation of the rotary table stops, the rotation speed of the table is lower than the predetermined degree, the positional displacement of the wafer easily occurs as well.

BRIEF SUMMARY OF THE INVENTION

The object of the present invention is to provide a rotary processing apparatus capable of firmly holding a substrate to be processed, such as wafer, even if the rotation speed of the rotary table is lower than a predetermined degree immediately after the start of the rotation of the table or immediately before the stop of the rotation.

According to the present invention, there is provided a rotary processing apparatus comprising a rotary table on which a substrate to be processed is placed; a rotary drive unit for rotating the rotary table; a plurality of holding members each rotating together with the rotary table, having a rotation supporting point at a position close to a peripheral portion of the rotary table, for holding a peripheral portion of the substrate to be processed, above the rotary table, being rotatable in a radial direction of the rotary table around the rotation supporting point, and including one end having a holding portion for holding the substrate to be processed, and another end having a portion to be pressed; an urging member, provided for the rotary table, for urging the holding portion of each of the plurality of holding members, towards a center of the rotary table; a pressing member, provided underneath the rotary table and being movable in up and down directions, for pressing the portion to be pressed to a direction opposite to the urging direction of the urging member; and a drive mechanism for driving the pressing member in up and down directions.

Further, according to the present invention, the drive mechanism is made of an air cylinder for driving the pressing member in up and down directions, by introducing or exhausting an inert gas.

Further, according to the present invention, the rotary processing apparatus provides with a gas path for supplying an inert gas towards a rear surface of the substrate to be processed, held above the rotary table.

In the rotary processing apparatus of the present invention, the urging member for urging a holding portion of each holding member towards the center of the rotary table, and therefore in a normal state, the holding member holds the peripheral portion of the substrate to be processed. In order to release the substrate to be processed from a hold state, the pressed portion located on the other end of the hold member is pressed by the pressing member, and thus the holding member releases its hold despite the urging force of the urging member. In order to hold the substrate to be processed, the pressing by the pressing member is released, and thus the substrate is held by the holding member with the urging force of the urging member. As describe above, since the substrate is already held in a still state, the positional displacement of the substrate does not occur even if the rotation speed of the rotary table has not yet reached a predetermined speed. It is only natural that the positional displacement does not occur even immediately before the rotary table is stopped.

Further, as the rotary table is rotated, the weight located below the rotation supporting point is pushed outwards by the centrifugal force, and therefore one end of the holding member is pushed towards the center of the rotary table. With this structure, while the rotary table is being rotated, the substrate is held by means of the centrifugal force acting on the weight in addition to the urging force of the urging member, and therefore the substrate can be held in a more stable way.

When the pressing member is provided above a substantially ring-like press supporting member driven by one drive mechanism, the release of a plurality of holding members can be performed by one drive mechanism. The substantially ring-like shape is not limited to a circular ring-like shape, but may be a shape a part of which is cut, for example, substantially C shape in plan.

Further, when an air cylinder for driving the pressing member in up and down directions by introducing or exhausting an inert gas, is used as a drive mechanism, an appropriate pressure can be easily obtained. Furthermore, since nitrogen gases or some other inert gases are used, the contamination of the atmosphere in which the apparatus is placed, can be prevented.

Also, when the inert gas introduced to the air cylinder is directed towards the rear surface of the substrate held above the rotary table, so as to make it possible to supply the gas, the contamination of the atmosphere on the rear surface side of the substrate can be effectively prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to accompanying drawings.

Figure 1:
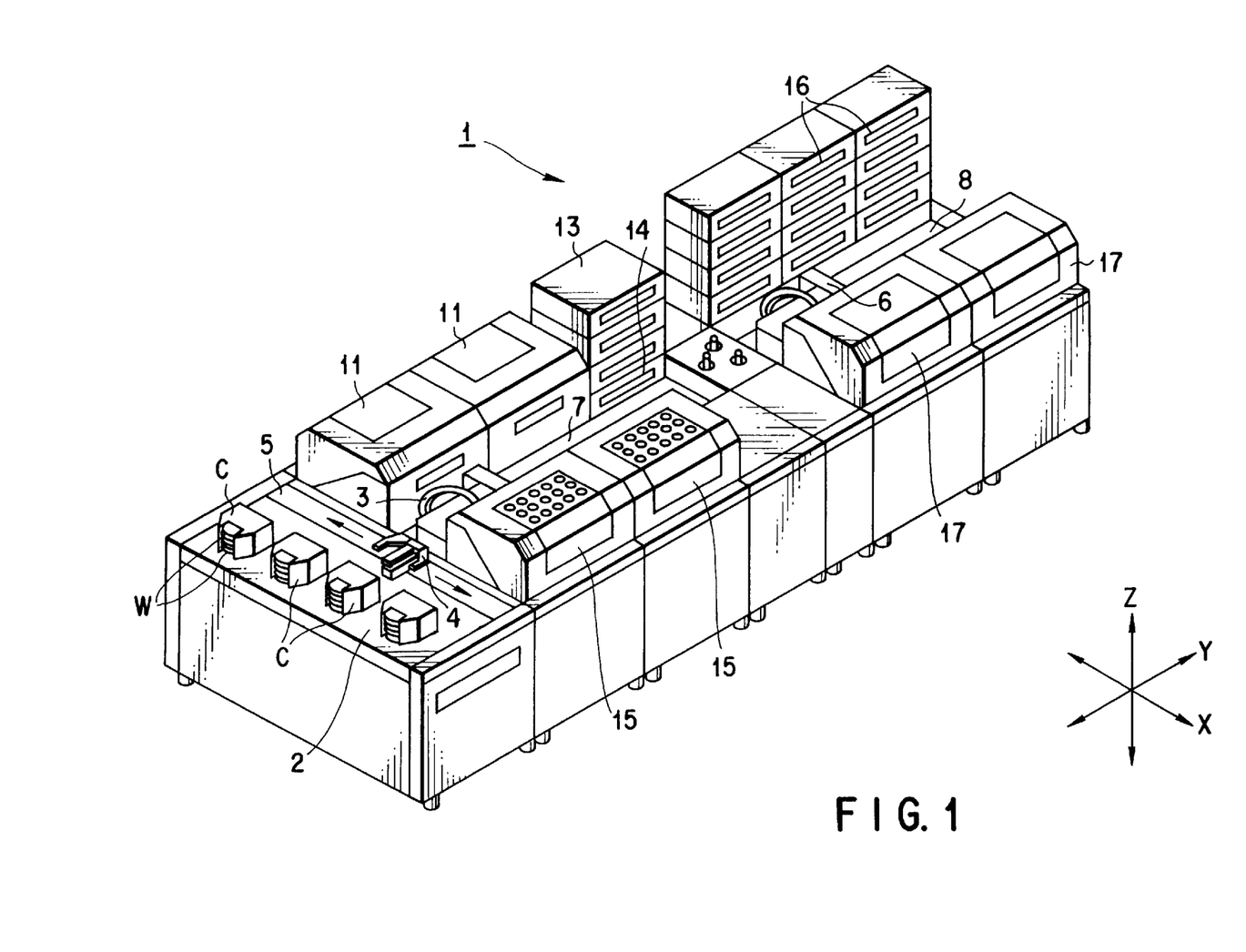
FIG. 1 is a perspective view of a photoresist coating/developing system, in which a rotary cleaning machine according to an embodiment of the present invention is built.

FIG. 1 shows a photoresist coating/developing system 1 equipped with a rotary processing apparatus according to this embodiment, serving as a rotary cleaning machine, and this system includes a cassette table 1 in which a plurality of cassettes C are housed in order, each cassette serving as a wafer storage unit for containing a plurality of cassettes C, and a transfer machine 4 for unloading a wafer W in a cassette C housed in the cassette table 2 and transfer it to a main transfer arm 3 located in a processing section. The transfer machine 4 is placed movable on a transfer path 5 provided along a direction in which cassettes C are arranged in order (that is, in the X direction).

In the processing section, various branch-type processing machines each carrying out a preset process on wafers W one by one, are placed on both sides which interpose the main transfer arm 3 and transfer paths 7 and 8 for other main transfer arms.

Rotary cleaning machines 11 serving as rotary processing apparatus of this embodiment are placed on one side of the transfer path 7. Further, an adhesion processing machine 13 for subjecting the surface of a wafer W to an adhesion-process and improving the adhesion of the photoresist, a cooling machine 14 for cooling the wafer W to a predetermined temperature, photoresist coating machines 15 for coating the surface of a rotating wafer W with a photoresist solution, a heating machine 16 for heating a wafer W after being coated with the photoresist solution and heating a wafer W after an exposure, and developing machines 17 for developing the wafer W by supplying the developer solution on the surface of the wafer W while being rotated, after the exposure, are arranged in order so as to interpose the transfer paths 7 and 8. As these members are arranged in an aggregated set, a high efficiency of the process can be achieved. Further, the loading or unloading of wafers to or from each of the processing devices is carried out with the main transfer arms 3 and 6.

Figure 2:
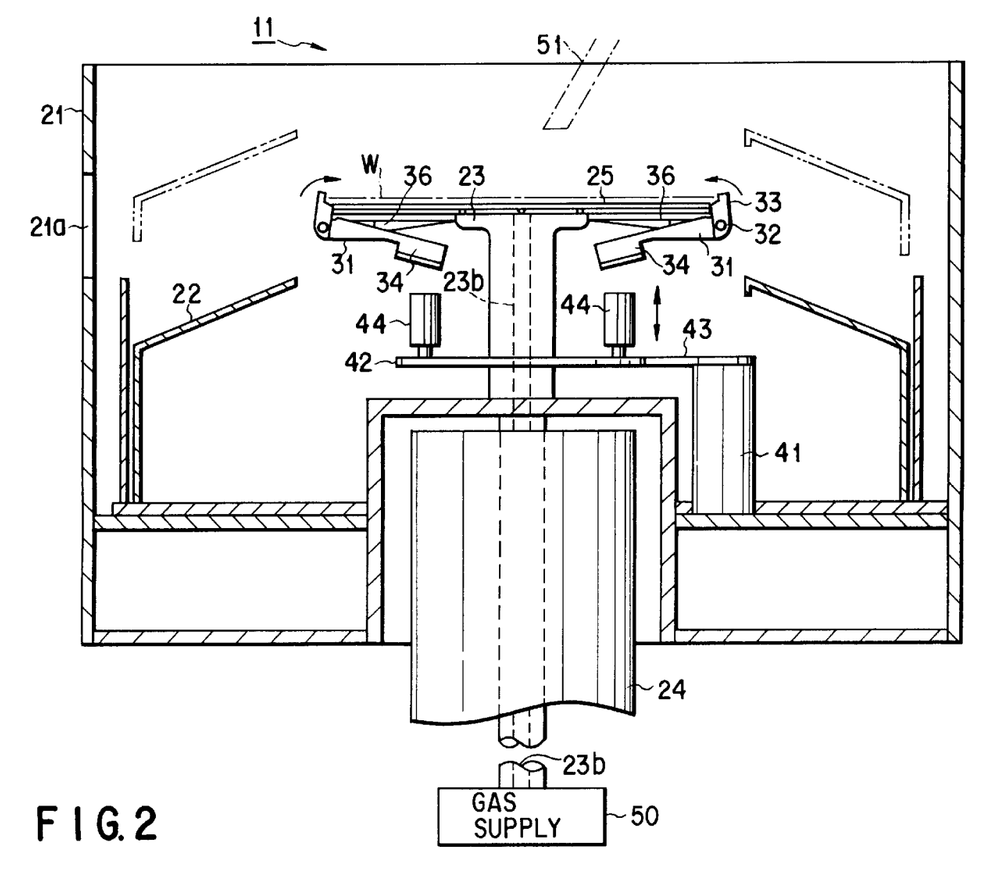
FIG. 2 is a partial longitudinal sectional view of the rotary cleaning machine according to the embodiment.
Figure 3:
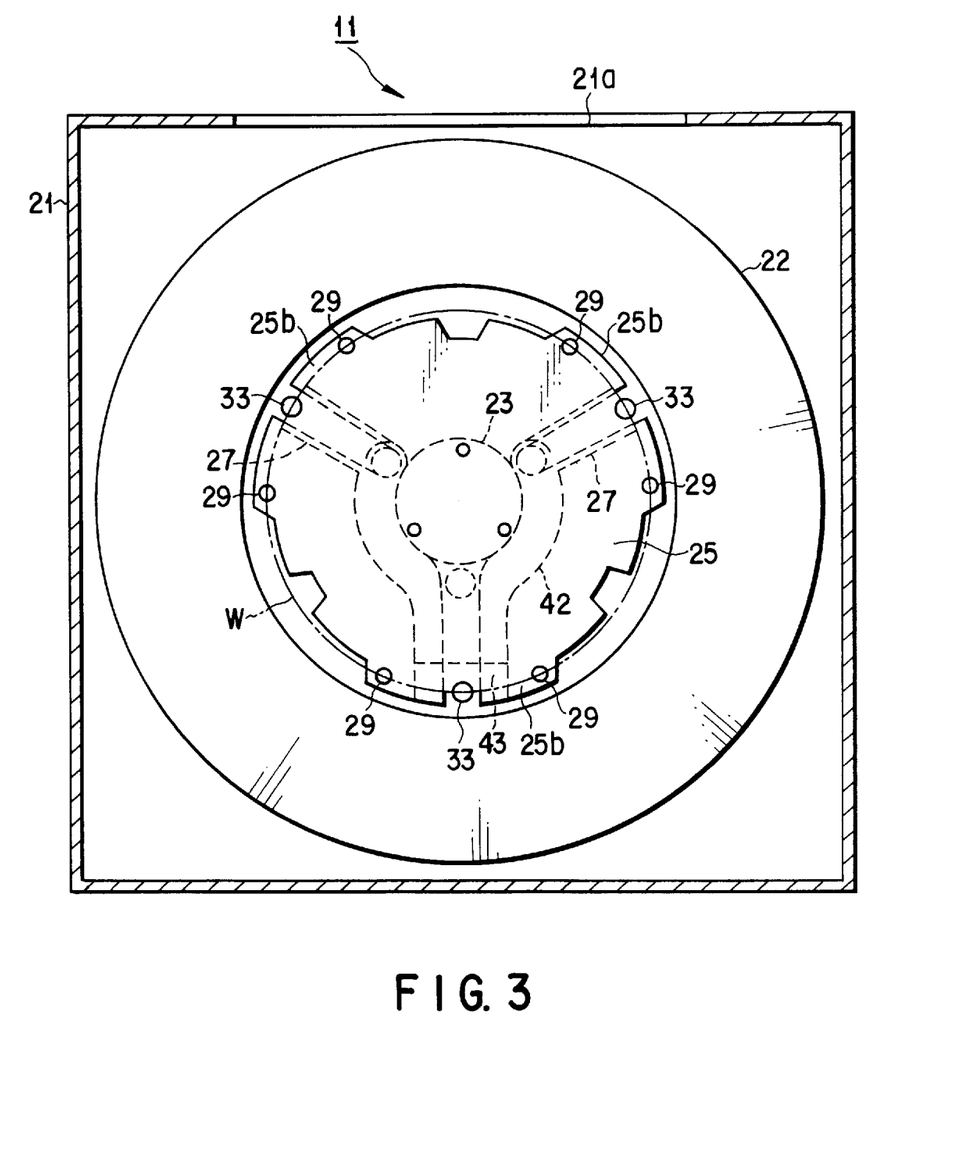
FIG. 3 is a plan view of the rotary cleaning machine according to the embodiment.

As can be seen in FIGS. 2 and 3, the rotary cleaning machine 11 of this embodiment has a casing 2 having a cubical shape having an inlet/outlet 21a for the main transfer arm 3 on one side, and a cup 22 having an opening on its top surface and substantially a cylindrical shape is provided in the casing 2. The cup 22 is set movable in up and down directions to a position indicated by the broken lines in the figure, within the casing 21. As an alternative structure, it is possible that a rotary table 25 is moved in up and down directions.

Figure 4:
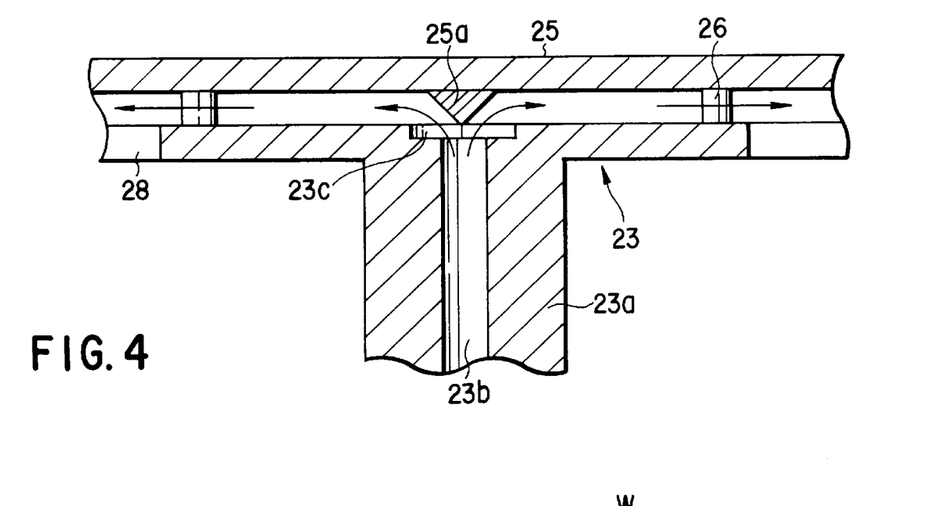
FIG. 4 is an enlarged longitudinal sectional view of a central portion of a rotary table of the rotary cleaning machine according to the embodiment.

At the central position of the casing 21, a rotary drive member 23 is situated. The rotary drive member 23 is rotated at a predetermined rotation number as it is driven by a motor 24 provided outside the casing 21. As shown in FIG. 4, a rotary table 25 is fixed with an appropriate fixing member 26 to the rotary drive member 23 to be apart therefrom by a certain distance.

As shown in FIGS. 2 and 4, a gas path 23b is formed within a shaft 23a of the rotary drive member 23, and inert gases supplied from an inert gas supply source 50, such as nitrogen gases, are blown from an opening 23c made towards a projection 25a having a reverse conical shape formed at the center of the bottom surface of the rotary table 25. The inert gases thus blown are dispersed radially, that is, to a backward direction, by means of the projection 25a, and are allowed to flow to the periphery portion of the rotary table 25 along the bottom surface of the table 25. Thus, the rotary table 25 also has a function of a gas diffusing plate.

To the rotary drive member 23, a supporting plate 28 having supporting ribs 27 arranged at three locations in radial directions (at every 120° degrees of angle as viewed from above) is mounted. Alternatively, the supporting plate 28 may be fixed to the rotary table 25, or in short, various structures are possible as long as the plate 28 can rotate as an integral unit with the rotary drive member 23 and the rotary table 25.

In the meantime, on the peripheral portion of the rotary table 25, three projected parts 25b are formed, and a guide pin 2 for guiding the peripheral portion of a wafer W to a predetermined position and supporting the wafer is provided on locations close to end portions of the upper surface of each of the projected parts 25b. Therefore, with six guide pins 29 in total, the wafer W is supported as it is floating above the rotary table 25.

Figure 5:
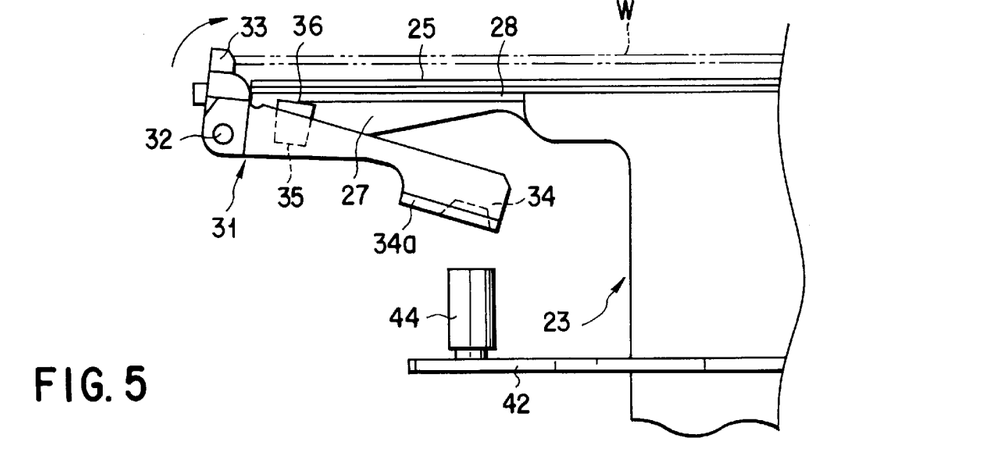
FIG. 5 is a lateral view of the peripheral portion of the rotary table of the rotary cleaning machine according to the embodiment, when the holding member is in a holding state.
Figure 6:
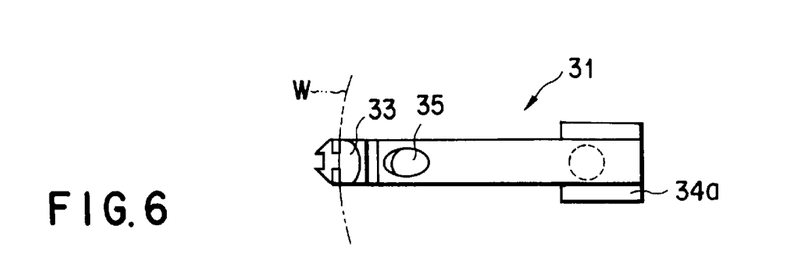
FIG. 6 is a plan view of the holding member used in the rotary cleaning machine according to the embodiment.
Figure 7:
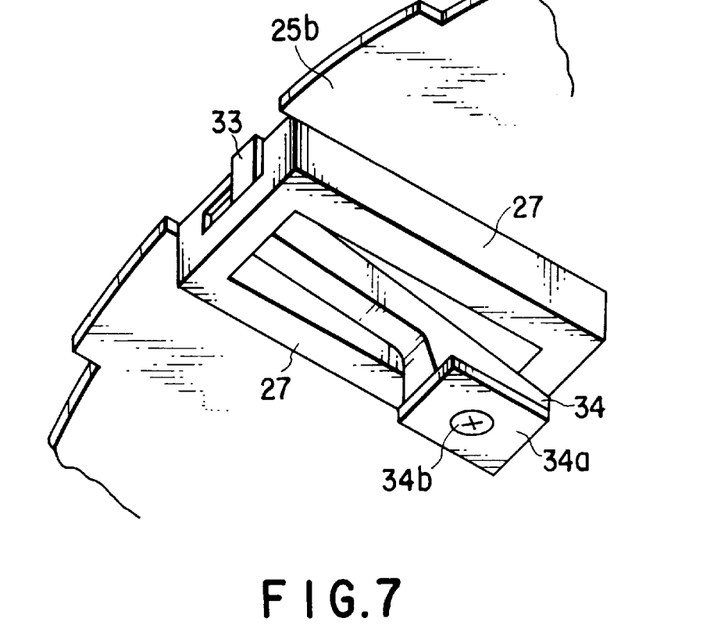
FIG. 7 is a perspective view of the holding member used in the rotary cleaning machine according to the embodiment.

As can be seen in FIGS. 5 and 6, a supporting member 31 is mounted on each of the supporting rib 27, to be rotatable to backward direction of the rotary table 25. Each of the supporting members 31 has a lateral surface of substantially an angle shape, and a holding portion 33 which can hold the peripheral portion of a wafer W is provided on one end of the lateral surface, that is, the end located above the rotation supporting point 32 set by the bent portion. Further, at the other end portion, a pressurized portion 34 is provided. On the lower surface side of the pressurized portion 34, a guide member 34a is fixed by means of a belleville screw 34b or the like as shown in FIG. 7. The guide member 34a can serve also as a weight. With this structure, if a sufficient centrifugal force cannot be generated for the holding member 31 solely with the pressurized portion 34, the guide member 34a serves as a weight in order to increase the centrifugal force.

A hole-shaped stopper portion 35 is made in the upper surface located on the other end portion from the rotation supporting point 32 of the holding member 31, and an urging member 36 is inserted and provided between the stopper portion 35 and a predetermined position on the lower surface of the supporting plate 28 interposed between the supporting ribs 27. The urging member 36 contains an elastic member such as a spring member, inside, and as shown in FIG. 5, the member serves to urge the other end portion of the rotation supporting point 32 of the holding member 31, that is, the pressurized portion 34 side, downwards. With this structure, in a normal state, one end side of the holding member 31, that is, the holding portion 33 side, is urged towards the center of the rotary table 25.

As can be seen from FIGS. 2, 3 and 5, the holding portion 33 of the holding member 31 projects out from the upper surface of the rotary table 25 via a cut portion made in the rotary table, and thus the holding portion 33 can hold the peripheral portion of the wafer W held, as it is guided by the guide pins 29.

Figure 8:
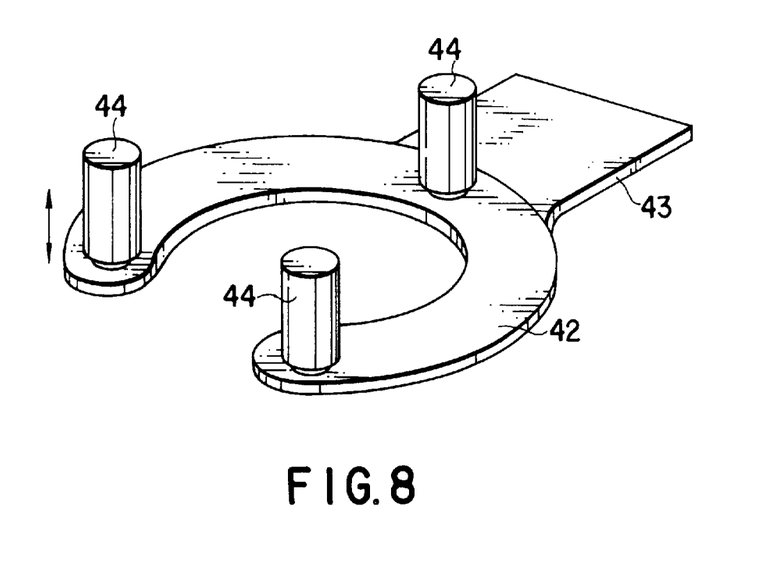
FIG. 8 is a perspective view of the press supporting member used in the rotary cleaning machine according to the embodiment.

In the cup 22, an air cylinder 41 serving as a driving mechanism is provided, and a press supporting member 42 shown in FIG. 8 is fixed to a slide portion on the upper surface side of the air cylinder 41 via a bracket 43. In the air cylinder 41, the slide portion moves up as inert gases such as nitrogen gases are introduced to the cylinder, and accordingly the press supporting member 42 moves up. Reversely, when the inert gases in the cylinder are exhausted by an exhaustion machine, the slide portion moves down, and accordingly the press supporting member 42 moves down. In addition to this structure, when a solenoid switch valve or the like is provided to switch over to an exhaustion flow path side where the pressure is lower at all times, the switching operation to move up or down the slide portion can be quickly performed.

The press support member 42 has a plan form of a substantially C shape, and on the upper surface thereof, a pressing member 44 is provided at three locations. More specifically, three pressing members 44 are provided at positions corresponding to the pressurized portions 34 of the three holding members 31, that is, every 120 degree position when viewed from above. Each of the pressing members 44 contains an elastic member such as a spring member, inside, so as to assure a shock relaxation with respect to the press supporting member 42.

Figure 9:
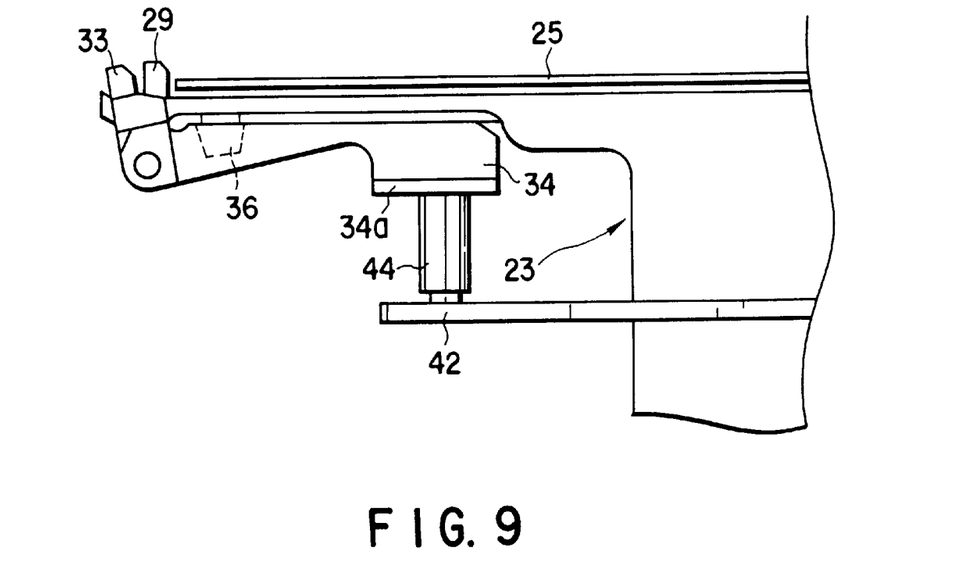
FIG. 9 is a lateral view of the peripheral portion of the rotary table of the rotary cleaning machine according to the embodiment, when the holding member is in a releasing state.

When the press supporting member 42 moves up as driven by the air cylinder 41, each of the pressing members 44 abuts on the guide member 34a of the pressurized portion 34 of the respective holding member 31, and as it further pushes the press supporting member 42. Thus, as shown in FIG. 9, the pressurized portion 34 side of the holding member 31 is pushed up despite the urge by the urging member 36, and therefore the holding portion 33 is opened outwards.

The main portion of the rotary cleaning machine 11 of the embodiment has such a structure as described above, and the operational effect and the like will now be described.

First, in the photoresist coating/developing system 1, a wafer W taken out from a cassette C by the transfer mechanism 4 is transferred into the cleaning machine through the inlet/outlet 21a of the casing 21, and placed on the guide pins 29 provided on the peripheral portion of the rotary table 25 by means of the main transfer arm 3. At this point, the cup 22 is situated at the lowest position as can be seen in FIG. 2. On the other hand, the press supporting member 42 moves up, and the pressing member 44 presses the pressurized portion 34 of the holding member 31 so as to open the holding portion 33 of the holding member 31, outwards.

When a wafer W is supported by the guide pins 29, the main transfer arm 3 retreats out from the casing 21 through the inlet/outlet 21a. At the same time, the inert gases in the air cylinder 4 are exhausted, and thus the press supporting member 42 moves down. As the press supporting member 42 moves down, the pressurization of the pressing member 44 on the pressurized member 34 is released, and the holding member 31 is rotated downside as being urged by the urging member 36. Thus, as shown in FIG. 5, the holding portion 33 holds the peripheral portion of the wafer W.

After that, the rotary drive member 23 is rotated by the motor 24, and accordingly the rotary table 25 is rotated. Further, the wafer W held by the holding member 31 is rotated. At the same time, nitrogen gases, for example, are blown from the opening 23c of the gas path 23b made in the shaft 23a of the rotary drive member 23. Then, the gases are diffused to the peripheral portion along the lower surface of the rotary table 25, and allowed to flow up from the peripheral edge of the wafer W.

Then, as can be seen in FIG. 2, a nozzle 51 provided within the device, for discharging cleaning water, is carried to a predetermined position above the wafer W, and the cleaning water such as pure water is discharged onto the wafer W. Thus, the wafer W is subjected to a preset cleaning process.

During the cleaning process, the wafer is rotated at a high rotation speed as high as, for example, 3000 rpm to 4000 rpm, and therefore the wafer W must be stably held on rotary table by the chuck. In the rotary cleaning machine 11 of the embodiment, the holding portion of the holding member 31 holds the peripheral portion of the wafer W with the urging force of the urging member 36. Further, while the holding portion 33 of the holding member 31 is holding the peripheral portion of the wafer W, the section close to the pressurized portion 34 provided with a weight 34a is situated lower than the rotation supporting point 32.

With the above-described structure, due to the centrifugal force acting on the pressurized portion 34 side, the pressurized portion of the holding member 31 is urged to move outwards. As a result, the holding portion 33 of the holding member 31 is pressed towards the center of the rotary table 25, and consequently the wafer W is held even more firmly. Thus, an appropriately cleaning process can be carried out.

Further, during the rotary processing, that is, while the wafer W is being cleaned, the inert gases are blown outwards, from the center of the lower surface of the rotary table 25, and exhausted from the peripheral portion of the rotary table 25, more accurately, the peripheral portion of the wafer W, to the outside. Therefore, it becomes possible to avoid the entering of particles and the like, to the vicinity of the rear surface of the wafer W, thus preventing the contamination of the rear surface of the wafer W.

Even if the rotation speed of the rotary table 25 has not yet reached a certain degree, which takes place immediately after the start of the rotary table 25 or immediately before the stop, the positional displacement of the wafer W does not occur since the wafer W is held with the holding portion 33 of the holding member 31 urged by the urging member 36.

In order to release the wafer W from the holding portion 33 of the holding member 31 urged by the urging member 36 when stopping the rotary table 25 after finishing the cleaning process and a drying process which follows, the press supporting member 42 is moved up by driving the air cylinder 41, and the pressurized portion 34 of the holding member 31 is pressed with the pressing member 44. Thus, the wafer held by the holding portion 33 is released. In this releasing operation, all the holds set by the holding members 31 can be released simply by moving on press supporting member 42 up, and therefore the structure which surrounds the rotary table 25 and the rotary drive means 23 can be simplified, and the load on the motor 24 is lessened.

Further, the pressing member 44 contains an elastic member or the like, inside, and exhibits a shock relaxing property, and therefore the release of the wafer W from the holding member 31 urged can be very smoothly carried out. The pressurized portion 34 of the holding member 31 is provided with the guide 34a also serving as a weight, and therefore the pressing member 44 can surely press the pressurized portion 34 even if some positional displacement occurs. Therefore, the release of the holding member 31 can be performed in a stable way.

Figure 10:
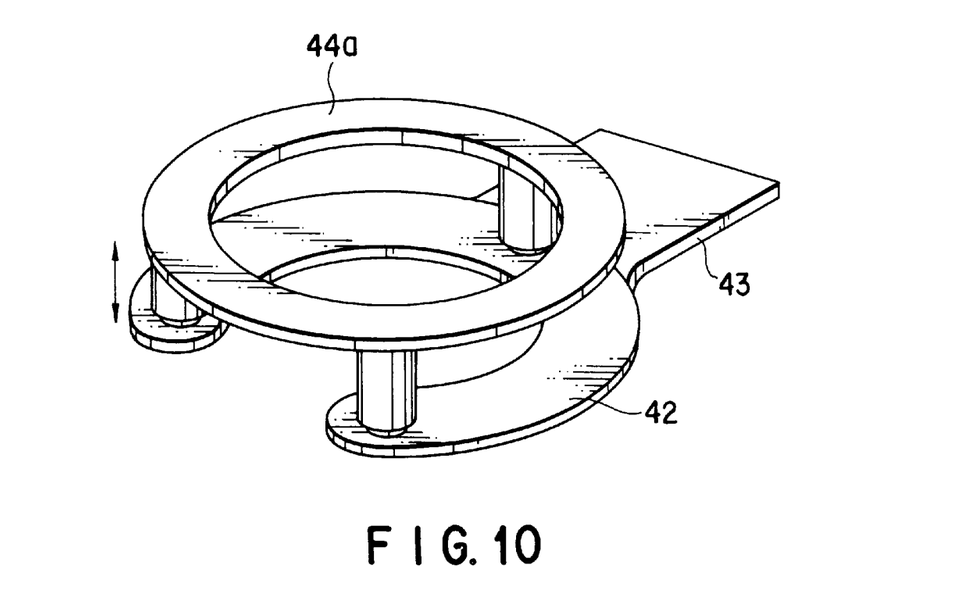
FIG. 10 is a perspective view of other holding member used in the rotary cleaning machine according to the embodiment.

It should be noted that in place of the structure of the embodiment in which a plurality of pressing members 44 are provided, when the pressing member itself is formed into substantially a ring shape as shown in FIG. 10, all the holding members 31 can be released always at once, no matter what position the rotary table 25 stops, in other words, no matter what positions the holding members 31 are situated at.

Figure 11:
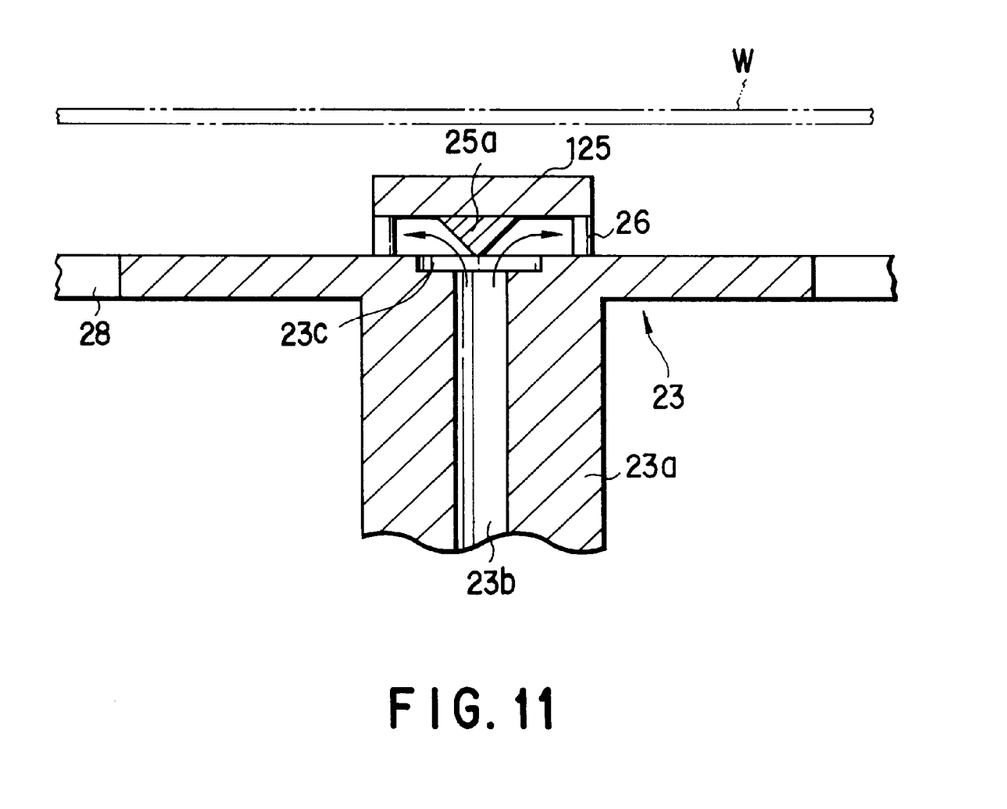
FIG. 11 is an enlarged longitudinal sectional view of a central portion of a rotary table of the rotary cleaning machine according to the embodiment.

Further, the rotary table 25 may be constructed by a small diameter rotary table 125 arranged over and spaced from the central portion of the rotary drive member 23 as shown in FIG. 11. In this case, the inert gas through the gas path 23b of the rotary drive member 23 flows along the rear surfaces of the rotary table 125 and the wafer W. In other words, the rotary table 125 functions as a rectifying plate for flowing the inert gas along the rear surface of the wafer.

Further, in the embodiment, inert gases such as nitrogen gases are used as those for driving the air cylinder 41; however it is also possible as an alternative structure, to use air, or more preferably, cleaned air for driving the air cylinder 41. Further, when the supply source and supply path for the inert gases blown from the central portion of the rotary drive member 23 are made in common, the structure around the device can be further simplified.

The embodiment is formed as a rotary cleaning apparatus for carrying out a cleaning process on a wafer W by discharging cleaning water such as pure water onto the wafer; however the present invention is not limited to this embodiment, but can be limited to other type of rotary processing apparatus for carrying out a process by supplying a process solution onto a wafer while rotating the wafer. Further, the substrate to be processed by the present invention is not limited to an object having substantially a round shape, but the present invention can be applied to a substrate having a rectangular shape such as an LCD substrate.

With the rotary processing apparatus according to the present invention, as described above, the positional displacement of the substrate to be processed does not occur even if the rotation speed of the rotary table is still lower than a predetermined rotation speed, and therefore the substrate can be held always at a preset position. Further, while the rotary table is rotated, the substrate is held with a centrifugal force acting on the weight, in addition to the urging force of the urging member, and therefore the substrate can be held in a very stable way. In particular, the release of a plurality of holding members can be performed with one drive mechanism, and therefore the structure of the apparatus can be simplified.

Furthermore, if nitrogen gases or some other inert gases are used, the contamination of the atmosphere in which the apparatus is placed, can be prevented. Also, the inert gases can be supplied towards the rear surface of the substrate held above the rotary table, the contamination of the atmosphere on the rear surface side of the substrate can be effectively prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A rotary processing apparatus comprising:
   a rotary table on which a substrate to be processed is placed;
   a rotary drive unit for rotating said rotary table;
   a plurality of holding members each rotating together with said rotary table, having a rotation supporting point at a position close to a peripheral portion of said rotary table, for holding a peripheral portion of said substrate to be processed, above said rotary table, being rotatable in a radial direction of said rotary table around the rotation supporting point, and including one end having a holding portion for holding said substrate to be processed, and another end having a portion to be pressed;
   an urging member, provided for said rotary table, for urging said holding portion of each of said plurality of holding members, towards a center of said rotary table;
   a pressing member, provided underneath said rotary table and being movable in up and down directions, for pressing said portion to be pressed to a direction opposite to the urging direction of said urging member; and
   a drive mechanism for driving said pressing member in up and down directions.

2. A rotary processing apparatus according to claim 1, wherein said pressing member contains an elastic member for shock relaxation.

3. A rotary processing apparatus according to claim 1, wherein said pressing member is made of a ring-like portion for pressing said pressing member as it is moved upwards.

4. A rotary processing apparatus according to claim 1, wherein a weight is provided on said portion to be pressed, at a position lower than that of the rotation supporting point.

5. A rotary processing apparatus according to claim 1, further comprising a press supporting member having substantially a ring-like shape, for supporting said pressing member, said press supporting member being driven by said drive mechanism in up and down directions.

6. A rotary processing apparatus according to claim 5, wherein said pressing member contains an elastic member for shock relaxation.

7. A rotary processing apparatus according to claim 5, wherein said press supporting member includes at least three pressing members arranged in a circumferential direction at an equal interval.

8. A rotary processing apparatus according to claim 5, wherein said pressing member is made of a ring-like member which presses said pressing member as it is moved upwards.

9. A rotary processing apparatus according to claim 5, wherein said holding member releases a hold of said substrate to be processed, in such a manner that said pressing member abuts on the to-be-pressed portion of said holding member and further pushes the to-be-pressed portion upwards, as said press supporting member is moved upwards by said drive mechanism.

10. A rotary processing apparatus according to claim 5, wherein said holding portion holds the peripheral portion of said substrate to be processed, in such a manner that the press on said to-be-pressed portion by the pressing member is released and the holding member is rotated as urged by said urging member when said press supporting member is moved downwards by said drive mechanism.

11. A rotary processing apparatus according to claim 5, wherein said to-be-pressed portion is constructed to move outwards in a radial direction by a centrifugal force created as said rotary table is rotated by said rotary drive member, and said holding portion of said holding member associated with said to-be-pressed portion pushes the peripheral portion of said substrate to be processed, towards the center of said rotary table, thus securing the hold of said substrate.

12. A rotary processing apparatus according to claim 5, wherein a weight is provided on said portion to be pressed, at a position lower than that of the rotation supporting point.

13. A rotary processing apparatus according to claim 1, wherein said drive mechanism is made of an air cylinder for driving said pressing member in up and down directions, by introducing or exhausting an inert gas.

14. A rotary processing apparatus according to claim 13, wherein a weight is provided on said portion to be pressed, at a position lower than that of the rotation supporting point.

15. A rotary processing apparatus according to claim 13, wherein said pressing member contains an elastic member for shock relaxation.

16. A rotary processing apparatus according to claim 13, wherein said pressing member is made of a ring-like portion for pressing said pressing member as it is moved upwards.

17. A rotary processing apparatus according to claim 1, further including a gas path for supplying an inert gas towards a rear surface of said substrate to be processed, held above said rotary table.

18. A rotary processing apparatus according to claim 17, which has a rectifying plate guiding the inert gas along said rear surface of said to-be-processed substrate.

19. A rotary processing apparatus according to claim 17, wherein said rotary drive member is made of a motor coupled with said rotary table and having a hollow shaft having said gas path formed inside, and including a gas supply portion for supplying the inert gas towards the center of a rear surface of said rotary table via said gas path.

20. A rotary processing apparatus according to claim 19, wherein a weight is provided on said portion to be pressed, at a position lower than that of the rotation supporting point.

21. A rotary processing apparatus according to claim 19, wherein said pressing member contains an elastic member for shock relaxation.

22. A rotary processing apparatus according to claim 19, wherein said pressing member is made of a ring-like portion for pressing said pressing member as it is moved upwards.

23. A rotary processing apparatus comprising:
a rotary table on which a substrate to be processed is placed;
a rotary drive unit for rotating said rotary table;
a plurality of holding members each rotating together with said rotary table, having a rotation supporting point at a position close to a peripheral portion of said rotary table, for holding a peripheral portion of said substrate to be processed, above said rotary table, being rotatable in a radial direction of said rotary table around the rotation supporting point, and including one end having a holding portion for holding said substrate to be processed, and another end having a portion to be pressed;
an urging member, provided for said rotary table, for urging said holding portion of each of said plurality of holding members, towards a center of said rotary table;
a pressing member, provided underneath said rotary table, for pressing said portion to be pressed to a direction opposite to the urging direction of said urging member; and
a drive mechanism for driving said pressing member and said rotary table relatively in up and down directions such as to press or not to press said to-be-pressed portion by said pressing member.

* * * * *